(12) United States Patent
Spevak

(10) Patent No.: US 11,863,173 B2
(45) Date of Patent: Jan. 2, 2024

(54) CAPACITIVE COUPLING FOR CONNECTION OF REMOTELY PLACED CAPACITIVE SENSING ELECTRODES

(71) Applicant: TEXAS INSTRUMENTS INCORPORATED, Dallas, TX (US)

(72) Inventor: Peter Spevak, Moosburg an der Isar (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 855 days.

(21) Appl. No.: 16/543,874

(22) Filed: Aug. 19, 2019

(65) Prior Publication Data

US 2020/0059231 A1 Feb. 20, 2020

Related U.S. Application Data

(60) Provisional application No. 62/719,843, filed on Aug. 20, 2018.

(51) Int. Cl.
| | | |
|---|---|---|
| *H03K 17/96* | (2006.01) | |
| *G06F 3/044* | (2006.01) | |
| *H03K 17/955* | (2006.01) | |
| *G01R 27/26* | (2006.01) | |
| *H01L 49/02* | (2006.01) | |

(52) U.S. Cl.
CPC ....... *H03K 17/962* (2013.01); *G01R 27/2605* (2013.01); *G06F 3/044* (2013.01); *H01L 28/60* (2013.01); *H03K 17/955* (2013.01); *H03K 2017/9602* (2013.01)

(58) Field of Classification Search
CPC ............... H03K 17/962; H03K 17/955; H03K 2017/9602; H01L 28/60; G01R 27/2605; G06F 3/044
See application file for complete search history.

(56) References Cited

U.S. PATENT DOCUMENTS

| | | | |
|---|---|---|---|
| 7,667,468 B1 * | 2/2010 | Anderson ................ | G01D 5/24 324/676 |
| 8,613,419 B2 * | 12/2013 | Rodenbeck ............. | E03C 1/055 251/129.03 |
| 8,944,105 B2 * | 2/2015 | Rodenbeck ............. | E03C 1/057 137/801 |
| 2011/0054818 A1 * | 3/2011 | Cantie .................. | H03K 17/955 702/65 |

* cited by examiner

*Primary Examiner* — Amy He
(74) *Attorney, Agent, or Firm* — Brian D. Graham; Frank D. Cimino

(57) ABSTRACT

A system includes a housing, a sensing electrode disposed within the housing, and a connecting electrode. The system also includes a capacitive sensing circuit galvanically connected to the connecting electrode at a first port, but not to the sensing electrode. The capacitive sensing circuit is configured to determine a first capacitance between the first port and a ground. The first capacitance includes a variable capacitance between the connecting electrode and a person when the person is touching the housing.

20 Claims, 4 Drawing Sheets

CAPACITIVE COUPLING FOR CONNECTION OF REMOTELY PLACED CAPACITIVE SENSING ELECTRODES

CROSS-REFERENCE TO RELATED APPLICATIONS

This application claims priority to U.S. Provisional Application No. 62/719,843, filed Aug. 20, 2018, which is hereby incorporated by reference.

BACKGROUND

In many capacitive sensing applications, especially those with proximity sensing or grip detection, the touch or grip surface is ergonomically-designed to accommodate users' hands. Such surfaces generally have non-flat and contoured surfaces which makes attaching such touch surfaces directly to a flat printed circuit board (PCB) difficult.

SUMMARY

In one example, a system (e.g., a tool) includes a housing, a sensing electrode disposed within the housing, and a connecting electrode. The system also includes a capacitive sensing circuit electrically connected to the connecting electrode at a first port, but not to the sensing electrode. The capacitive sensing circuit is configured to determine a first capacitance between the first port and a ground. The first capacitance includes a variable capacitance between the connecting electrode and a person when the person is touching the housing.

BRIEF DESCRIPTION OF THE DRAWINGS

For a detailed description of various examples, reference will now be made to the accompanying drawings in which.

DETAILED DESCRIPTION

As explained above, it can be difficult to directly attach a contoured capacitive touch surface to a PCB. The capacitive sensing electrode of the capacitance that is varying and is to be sensed may not be readily placed on the PCB itself. Further, manufacturing of a system (e.g., a tool) in which a sensing electrode is integrated into the system's housing and electrically connected to a sensing circuit can be difficult if connectors to the sensing electrode are needed. Long cables may be required, thereby making it difficult or impossible to have defined and constant conditions as the parasitic capacitance of such connections are dependent on the placement of the cables and may vary from system to system and be susceptible to vibration or displacement over time due to mechanical stress (e.g., vibration, acceleration, etc.).

The capacitive sensing electrode(s) in the examples disclosed herein is not directly, electrically (i.e., galvanically) connected to the integrated circuit (IC) that senses the variable capacitance. Instead, capacitive coupling between the IC and the sensing electrode is employed to assess capacitance.

Figure 1:
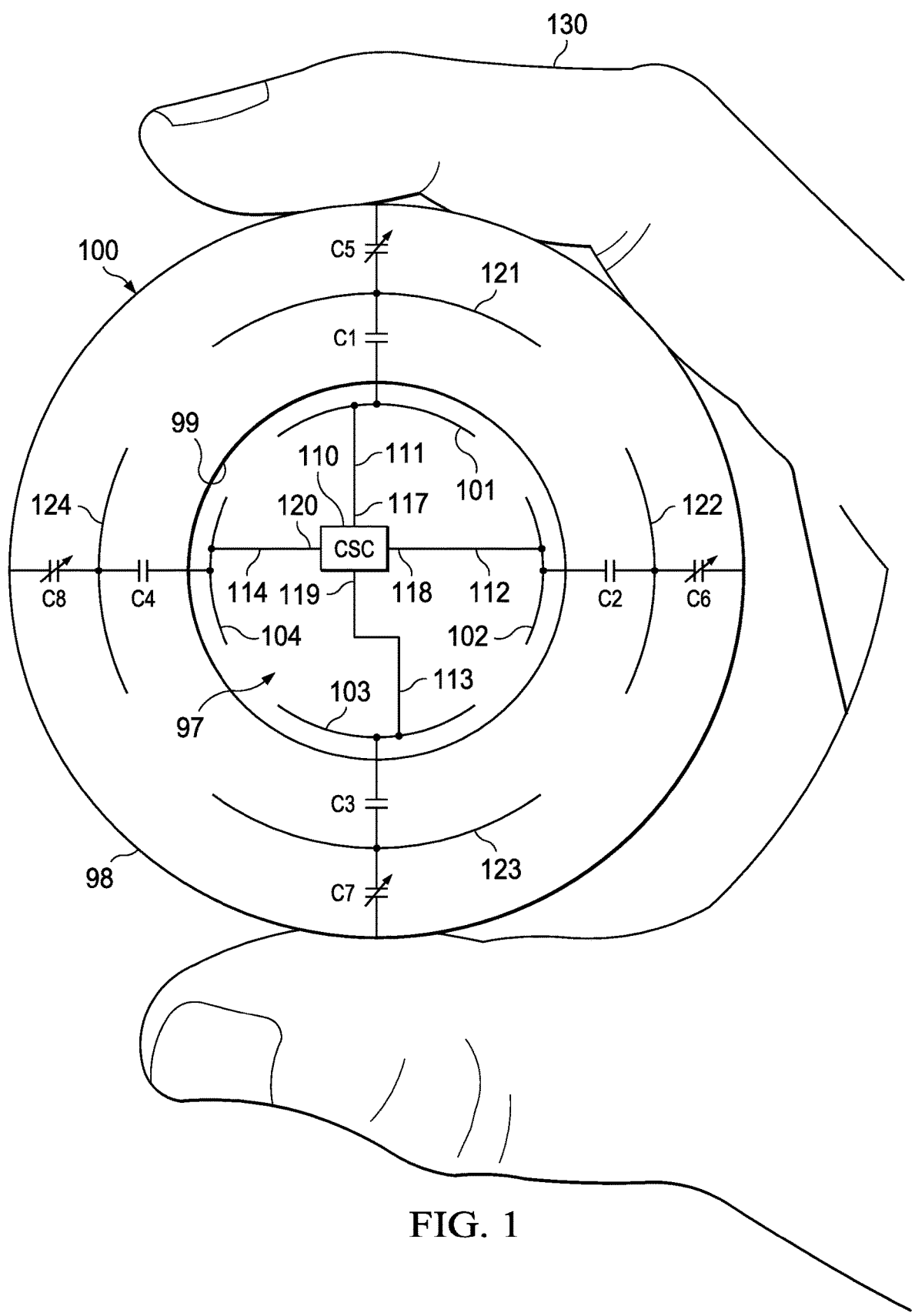
FIG. 1 illustrates a cross-section of a tool that employs capacitive touch sensing in accordance with some examples.

FIG. 1 shows an example of a cross-section of the housing 100 of a tool (machine, device, etc.) for which operation of the tool is controlled by sensing the variable capacitance between a user's hand 130 and the tool. The example housing 100 includes an outer surface 98 and an inner surface 99. The housing 100 may be constructed from plastic or other type of non-conductive material. The housing 100 is shown in this example as circular in cross-section, but the cross-section of the housing 100 may have other shapes as well. One or more sensing electrodes are embedded within the housing 100 between the outer and inner surfaces 98, 99. The example of FIG. 1 includes four sensing electrodes 121, 122, 123 and 124, although the number of sensing electrodes can be other than four (1, 2, 3, etc.). Each electrode 121-124 comprises a conductive member such as a wire, a conductive trace on a circuit board, a conductive plate, etc. The housing 100 includes regions of non-conductive material disposed between the sensing electrodes 121-124 and the outer surface 98, which form dielectric regions of capacitors described below.

The example of FIG. 1 also shows four connecting electrodes 101, 102, 103, and 104. FIG. 1 includes four connecting electrodes 101-104, although the number of connecting electrodes can be other than four (1, 2, 3, etc.). Each connecting electrode 101-104 is attached to the inner surface 99 of the housing 100. Adhesive, screws, mechanical pressure, or other types of attachment mechanisms may be used to attach the connecting electrodes 101-104 to inner surface 99. Each connecting electrode 101-104 is radially and longitudinally aligned with a respective one of the sensing electrodes 121-124 and separated by a region of non-conductive material of the housing 100 so that a capacitor is formed between the electrode and the respective sensing electrode (e.g., electrode 101 and sensing electrode 121). In that regard, the sensing electrodes 121-124 are each capacitively coupled to a respective connecting electrode of electrodes 101-104 without being directly electrically coupled.

The inner surface 99 defines a volume 97. A capacitive sensing circuit 110 is provided in this example within the volume 97 defined by the inner surface. The capacitive sensing circuit 110 may be fabricated as an IC and mounted on a PCB. In this example, the capacitive sensing circuit 110 galvanically connects to the connecting electrodes 101-104, but not to the sensing electrodes 121-124. Capacitive sensing circuit 110 has sense ports 117-120. Each sense port is electrically connected to a corresponding connecting electrode. For example, sense port 117 is connected to connecting electrode 101 by way of conductor 111. Sense port 118 of capacitive sensing circuit 110 is connected to connecting electrode 102 by way of conductor 112. Sense port 119 of capacitive sensing circuit 110 is connected to connecting electrode 103 by way of conductor 113. Sense port 120 of capacitive sensing circuit 110 is connected to connecting electrode 104 by way of conductor 114. Conductors 111-114 may comprise conductive wires, conductive springs, or other types of conductive mechanisms.

Capacitor C1 represents the capacitance between sensing electrode 121 and connecting electrode 101. Capacitor C2 represents the capacitance between sensing electrode 122 and connecting electrode 102. Capacitor C3 represents the capacitance between sensing electrode 123 and connecting electrode 103. Capacitor C4 represents the capacitance between sensing electrode 124 and connecting electrode 104. Each of the capacitances C1-C4 is a fixed value, that is, the capacitances of C1-C4 do not vary. The magnitude of the capacitance of C1-C4 is a function of the type of dielectric material comprising the housing 100 between the electrodes of each capacitor, the distance between the corresponding electrodes, the overlapping area of the corresponding electrodes, etc. In one example, the capacitances of C1-C4 generally all have the same capacitance value but can be different from each other in other implementations.

FIG. 1 illustrates a user's hand 130 near or in contact with the outer surface 98 of housing 100. Capacitance is created between the user's hand 130 and one or more of the sensing electrodes 121-124 depending on where the user's hand is in relation to the housing and the sensing electrodes. Further, the capacitance formed between the user's hand and the sensing electrode(s) varies based on how the user grips the housing, the amount of grip pressure applied, etc. In the example shown, variable capacitances C5, C6, C7, and C8 are created between sensing electrodes 121, 122, 123, and 124 and the user's hand. Because the user's hand 130 in this example is on the size of the housing opposite sensing electrode 124, the capacitance value of variable capacitance C8 is significantly lower than of C5-C7. The capacitive sensing circuit 110 detects and/or measures the variable capacitances C5-C8.

In more detail, the capacitive sensing circuit 110 measures the capacitance at each of the sense ports 117-120. The measured capacitance at a port may include contributions from the respective variable capacitance, the respective fixed capacitance, the conductor coupling the fixed capacitance to the sense port, and/or other sources. For example, the measured capacitance at sense port 117 may include contributions from variable capacitance C5, capacitance C1, and conductor 111.

In one example, the capacitive sensing circuit 110 outputs a signal indicating whether the user is gripping the housing based on the measurements at the sense ports 117-120 and, in turn, based on of the variable capacitances C5-C8. The capacitive sensing circuit's output signal may be provided to electronics that controls the operation of the tool.

As noted above, the capacitive sensing circuit 110 is not galvanically connected to the sensing electrodes. Instead, the capacitive sensing circuit 110 is electrically (galvanically) connected to the connecting electrodes, which are capacitively, but not directly electrically/galvanically, coupled to the sensing electrodes. If the capacitive sensing circuit 110 was electrically connected directly to the sensing electrodes 121-124, the wiring through the housing itself may be complicated during production and introduce varying amounts of stray capacitance as explained above. By not having a galvanic connection between the sensing electrodes and the capacitive sensing circuit, such problems are alleviated. Furthermore, where the housing 100 includes deformable materials such as rubberized plastic, if conductive connections extended through deformable portions into rigid portions, they may experience sheer stress at the interface when the housing 100 deforms. Some examples avoid this by capacitively the coupling sensing electrodes 121-124 to the connecting electrodes 101-104 instead of coupling them using conductive connections. In such examples, deformable materials are safely and reliability used throughout the housing 100 including between the sensing electrodes 121-124 and the connecting electrodes 101-104 and between the sensing electrodes 121-124 and the outer surface 98.

Figure 2:
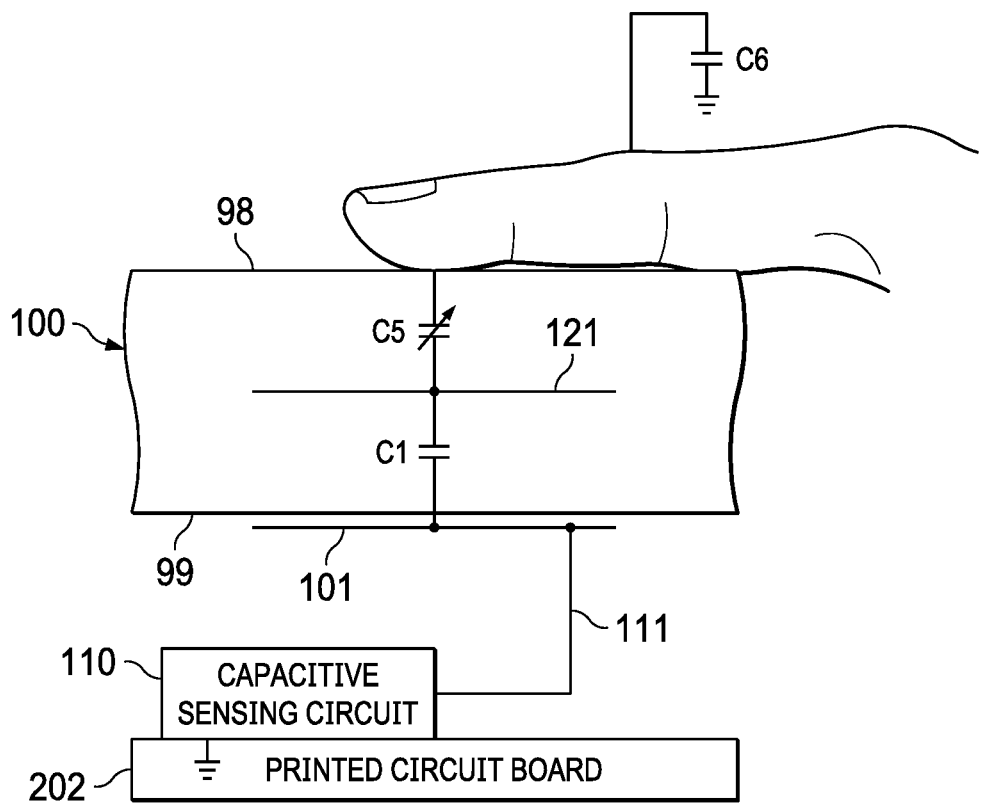
FIG. 2 illustrates a capacitive sensing system in which sensing electrodes are capacitively coupled to a capacitive sensing circuit in accordance with some examples.

FIG. 2 illustrates a portion of housing 100 with one of the sensing electrodes (sensing electrode 121) and one of the connecting electrodes (connecting electrode 101). Connecting electrode 101 is electrically connected to the capacitive sensing circuit 110 via conductor 111. The capacitive sensing circuit 110 is shown in this example an IC mounted on a PCB 202. FIG. 2 also illustrates that a capacitance Cb is formed between the user's body and the same ground potential used by the capacitive sensing circuit 110.

Figure 3:
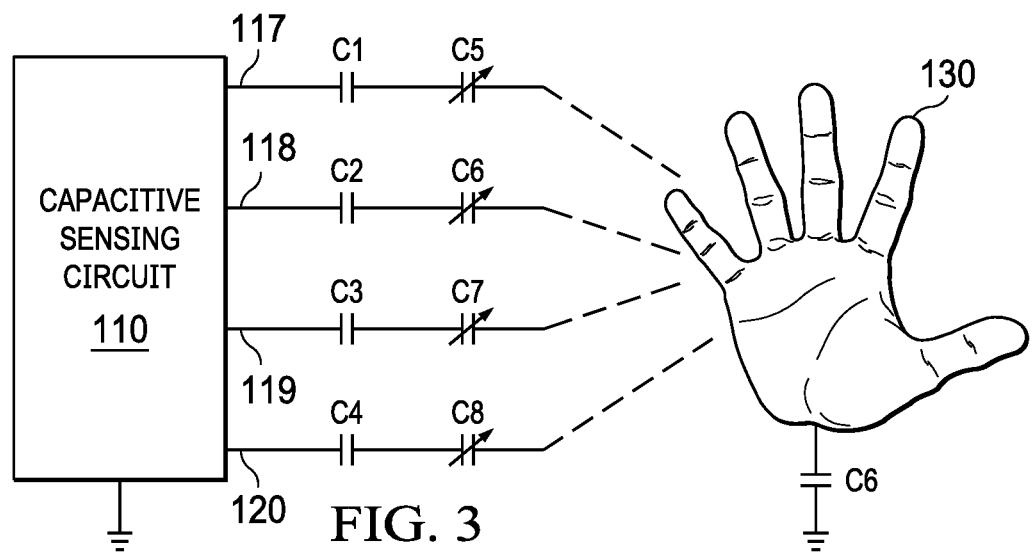
FIG. 3 illustrates a circuit of various capacitances including variable capacitances being sensed in accordance with some examples.

FIG. 3 illustrates an equivalent electrical circuit model of the various capacitances. Fixed capacitance C1 between sensing electrode 121 and connecting electrode 101 is in series with variable capacitance C5 between sensing electrode 121 and the user's hand 130. Similarly, fixed capacitance C2 between sensing electrode 122 and connecting electrode 102 is in series with variable capacitance C6. Fixed capacitance C3 between sensing electrode 123 and connecting electrode 103 is in series with variable capacitance 7 Fixed capacitance C4 between sensing electrode 124 and connecting electrode 104 is in series with variable capacitance C8. The variable capacitances C5-C8 represent the capacitance formed between the sensing electrodes and the user's hand 130, and depending on how the user grips the housing, the four variable capacitances C5-C8 will have varying capacitance values. For example, in FIG. 1, the three variable capacitances C5-C7 will have a substantially higher capacitance value than for variable capacitance C8 due to the position of the user's hand 130.

The use of multiple sensing electrodes 121-124 permits the capacitive sensing circuit 110 to discriminate between a person gripping the tool and the tool simply being placed on a conductive surface such as a table top. Placing the tool on surface such may cause a capacitance C5 or C6 or C7 or C8 to be created but generally not two or more of such capacitances. For example, if housing 100 in FIG. 1 were placed on a table top where the user's thumb is otherwise located, capacitance C7 may be created between the table top and sensing electrode 123. As will be explained below, capacitive sensing circuit 110 measures the equivalent capacitance between each of its sense ports 117-120 and ground. Responsive to the capacitive sensing circuit 110 determining the measured capacitance associated with that sense nodes to be greater than a threshold, the capacitive sensing circuit determines that a user has gripped the tool at an area of the housing near the corresponding sensing electrode. If the tool is simply placed on a table top, the measured capacitance for the two or more (e.g., three) sensing electrodes not adjacent the table top will be will be less than the measured capacitance for the sensing electrode adjacent the table top, and thus the capacitive sensing circuit 110 will not output a signal indicating a use has gripped the tool.

Figure 4:
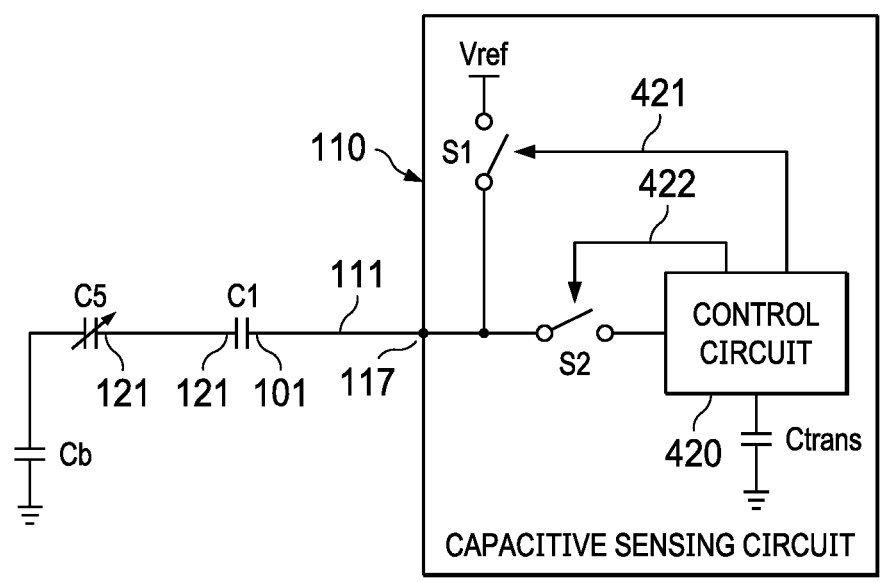
FIG. 4 illustrates an example of an implementation of a capacitive sensing circuit in accordance with some examples.

FIG. 4 illustrates one of the many possible connecting electrodes (e.g., connecting electrode 121) connected to an example capacitive sensing circuit 110. Fixed capacitance C1, variable capacitance C5, and capacitance Cb are shown in series in this example connected to the capacitive sensing circuit 110, and the other fixed and variable capacitances of the examples above have been omitted for sake of clarity. In this example, the capacitive sensing circuit 110 comprises a control circuit 420, a charge transfer capacitor Ctrans, and switches S1 and S2. The capacitive sensing circuit 420 implements a charge transfer technique to determine the effective capacitance between each of ports 117-120 (only port 117 is illustrated in FIG. 4) and ground. The effective capacitance includes variable capacitance C5. In some examples, control circuit 420 is a finite state machine. Control circuit 420 asserts control signals 421 and 422 to control the open/closed (on/off) state of switches S1 and S2, respectively. When switch S1 is closed and switch S2 is open, the capacitance at port 117 is charged using a reference voltage (VREF).

During a discharge phase, switch S1 is opened and switch S2 is closed thereby causing the charged capacitance at port 117 to discharge current through the control circuit 420. The charge from the capacitance at port 117 is used to charge the charge transfer capacitor Ctrans. Control circuit 420 calculates the amount of charge transferred between the capacitance at port 117 to the charge transfer capacitor Ctrans. In one example, the number of charge transfer cycles (e.g., using a counter to measure) needed for the voltage on the capacitor Ctrans to reach a predetermined voltage threshold determines the capacitance. In another example, a predetermined/fixed number of charge transfer cycles is performed and the resulting voltage on the capacitor Ctrans is measured (e.g., via an analog-to-digital converter) and mapped to a capacitance value. Other techniques besides charge transfer can be implemented as well to determine the capacitance.

Control circuit 420 then closes switch S1 and opens switch S2 to again charge the capacitance at port 117. Control circuit 420 operates the switches S1 and S2 to repeatedly charge the capacitance at port 117, and then transfer the charge from the onto charge transfer capacitor Ctrans while determining the amount of charge transferred in each cycle. The amount of charge transferred from the capacitance at port 117 is a function of the effective capacitance Ceff of the capacitance at port 117, which in turn is a function of the capacitance of variable capacitance C5. Each change/discharge cycle takes a fraction of a second (e.g., hundreds or thousands of charge/discharge cycles each second). A predetermined number of charge/discharge cycles (e.g., 100) may be implemented by control circuit 420 to determine the effective capacitance of the capacitance at port 117.

In some examples, the capacitive sensing circuit 110 first determines a reference capacitance at the port 117 at a time when the user is known to be beyond the detection range. The reference capacitance may include contributions from the fixed capacitance C1, the conductor 111, and/or other sources and may include a baseline contribution from variable capacitance C5. Additionally, or in the alternative, the capacitive sensing circuit 110 may be provided a reference capacitance at manufacturing or validation that is stored in control circuit 420. In operation, the capacitive sensing circuit 110 subsequently measures a capacitance at the port 117 when the user's hand 130 may be in proximity to the tool as described above. The subsequent capacitance measurement may be compared to the baseline contribution to determine the change in the variable capacitance C5 by factoring out (e.g., subtracting) the contributions from the fixed capacitance C1, the conductor 111, and other sources.

Figure 5:
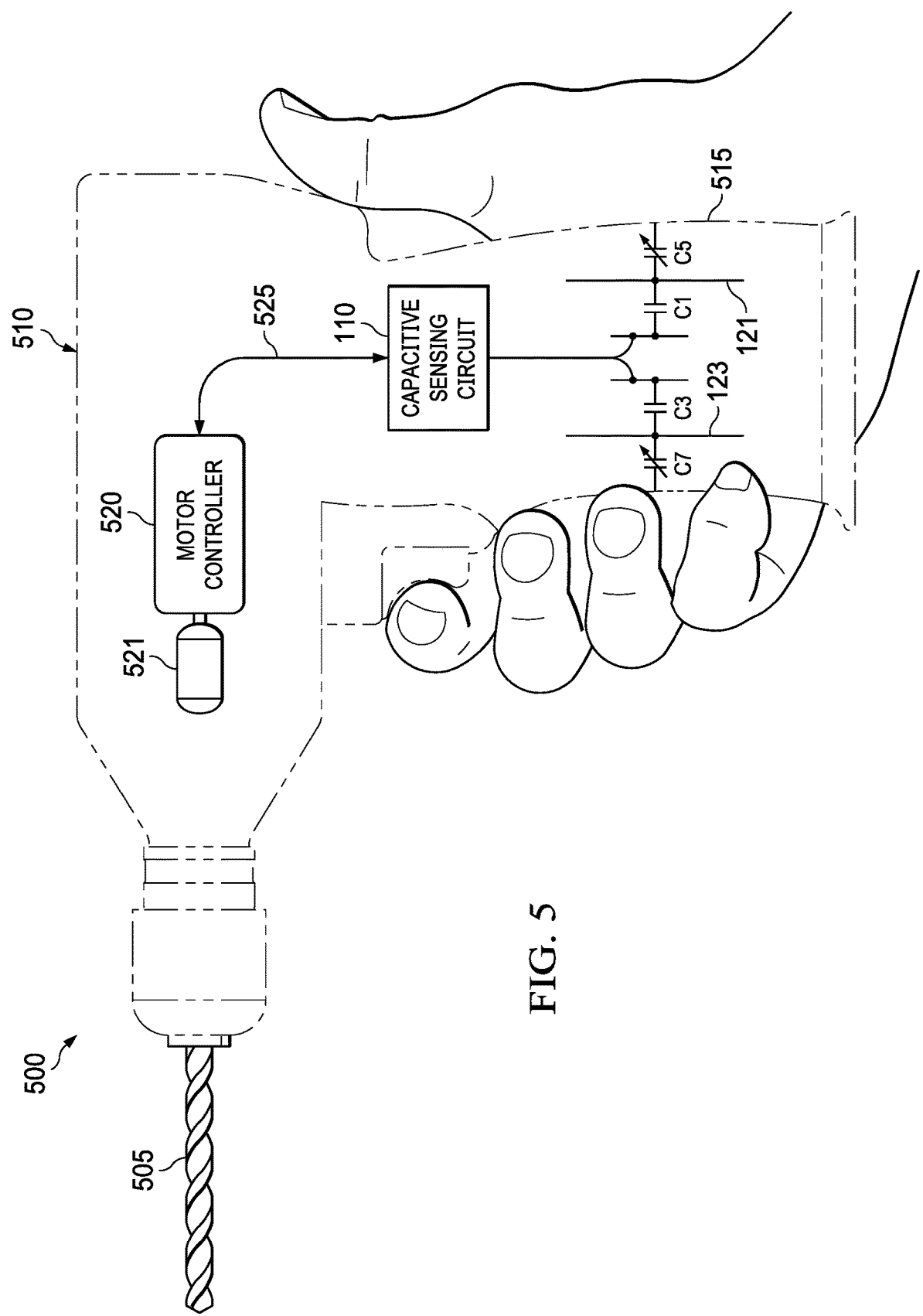
FIG. 5 illustrates an example of a drill employing a capacitive touch sensing architecture in accordance with some examples.

FIG. 5 shows an example of a tool in the form of a hand-held drill 500. The drill 500 includes a housing 510. The drill 500 has a motor controller 520 that controls the speed of a motor 521. The motor 521 turns a drill bit 505. A user's hand is shown gripping the handle 515 of the drill. The capacitive sensing circuit 110 is connected to connecting electrodes 121 and 123 (and there may additional connecting electrodes). The capacitive sensing circuit 110 detects that a user has gripped the tool and outputs a signal 525 to the motor controller 520. In one example, the motor controller 520 will prevent the motor from turning the drill bit 505 if the output signal 525 from the capacitive sensing circuit 110 indicates that capacitive sensing circuit 110 is not detecting a person gripping the drill 500. The capacitive sensing circuit 110 in this example functions as a safety mechanism to prevent the drill bit from turning unless a person is actively holding the drill's handle 515.

While a drill is illustrated in FIG. 5, other types of tools can employ the capacitive sensing technique described herein, such as joy stick operation of a crane, door handle of a car, etc. That it is detected that a person is touching (e.g., gripping) the joy stick, door handle, etc. will permit the operation of the corresponding functional hardware (crane, car door, etc.). Further, the capacitive sensing technique described herein can be applied to other types of sensing applications besides grip detection, such as buttons, wheels, sliders, etc.

"The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

What is claimed is:

1. A system, comprising:
   a housing having an outer surface and an inner surface, the inner surface defining an internal volume;
   a sensing electrode disposed within the housing;
   a connecting electrode disposed on the inner surface within the internal volume; and
   a capacitive sensing circuit galvanically connected to the connecting electrode at a first port, but not to the sensing electrode, the capacitive sensing circuit configured to:
   determine a first capacitance between the first port and a ground, the first capacitance including a variable capacitance between the connecting electrode and a person when the person is touching the housing;
   determine a second capacitance between the first port and the ground associated with a time when the person is not touching the housing; and
   determine a difference between the second capacitance and the first capacitance.

2. The system of claim 1, wherein:
   the sensing electrode is disposed within the housing between the inner and outer surfaces.

3. The system of claim 2, wherein the capacitive sensing circuit is disposed within the internal volume.

4. The system of claim 2, wherein the sensing electrode is a first sensing electrode and the connecting electrode is a first connecting electrode, and the system further includes:
   a second sensing electrode disposed within the housing between the inner and outer surfaces; and
   a second connecting electrode disposed on the inner surface within the internal volume;
   wherein the capacitive sensing circuit is galvanically connected to the first and second connecting electrodes, but not to the first and second sensing electrodes.

5. The system of claim 1, wherein the capacitive sensing circuit includes a charge transfer capacitor, and the capacitive sensing circuit is configured to determine the first capacitance through transfer of charge from the first capacitance to the charge transfer capacitor.

6. The system of claim 1, wherein the capacitive sensing circuit includes a control circuit and a capacitor, and the capacitive sensing circuit is configured to:
in a first state, couple the first port to a fixed voltage reference; and
in a second state, couple the first port to the control circuit to transfer charge from the first port to the capacitor.

7. The system of claim 1, wherein the system comprises a tool.

8. The system of claim 1, wherein the system comprises a drill.

9. A device comprising:
a capacitive sensing circuit having a port coupled to a first switch and a second switch, the capacitive sensing circuit further comprising a control circuit coupled to the first switch and the second switch, and to a transfer capacitor;
a conductor coupled to the port of the capacitive sensing circuit;
a first electrode coupled to the conductor;
a housing having a first surface and a second surface, the second surface disposed inside a first volume defined by the first surface, the second surface defining a second volume, wherein the first electrode is coupled to the housing; and
a second electrode disposed on the second surface and within the second volume of the housing, wherein the second electrode is capacitively coupled to the first electrode.

10. The device of claim 9, wherein the housing includes a first region of non-conductive material disposed between the first electrode and the second electrode.

11. The device of claim 10, wherein the first surface is an outer surface and a second region of non-conductive material disposed between the second electrode and the outer surface.

12. The device of claim 11, wherein the first and second regions of non-conductive material are deformable.

13. The device of claim 9, wherein the control circuit of the capacitive sensing circuit is configured to calculate an amount of charge transferred between a capacitance at the port to the transfer capacitor.

14. The device of claim 9, wherein the control circuit of the capacitive sensing circuit is configured to control the first switch and the second switch to charge a capacitance at the port.

15. The device of claim 14, wherein the first switch comprises a state opposite of a state of the second switch.

16. An apparatus, comprising:
a sensing electrode;
a housing with an outer surface and an inner surface, the inner surface enclosing an internal volume, wherein the sensing electrode is disposed between the outer surface and the inner surface;
a connecting electrode aligned with the sensing electrode and disposed within the internal volume of the housing;
a non-conductive region between the connecting electrode and the sensing electrode, the non-conductive region capacitively coupling the connecting electrode and the sensing electrode; and
a capacitive sensing circuit coupled to the connecting electrode.

17. The apparatus of claim 16, wherein the connecting electrode is attached to the inner surface of the housing.

18. The apparatus of claim 16, wherein the connecting electrode is radially and longitudinally aligned with the sensing electrode.

19. The apparatus of claim 16, wherein a capacitance between the sensing electrode and the connecting electrode depends on at least one of the non-conductive region, a distance between the sensing electrode and the connective electrode, and an overlapping area of the sensing electrode and the connective electrode.

20. The apparatus of claim 16, wherein the capacitive sensing circuit is configured to detect a user's hand on the housing by measuring a total capacitance at a port of the capacitive sensing circuit, the total capacitance including a variable capacitance and a capacitance between the sensing electrode and the connecting electrode.

* * * * *